United States Patent
Abdo

(10) Patent No.: US 11,552,239 B2
(45) Date of Patent: Jan. 10, 2023

(54) SUPERCONDUCTING QUBIT AND RESONATOR SYSTEM BASED ON THE JOSEPHSON RING MODULATOR

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 396 days.

(21) Appl. No.: 16/698,216

(22) Filed: Nov. 27, 2019

(65) Prior Publication Data
US 2021/0159384 A1    May 27, 2021

(51) Int. Cl.
*H01L 39/22* (2006.01)
*G06N 10/00* (2022.01)
*H01L 39/02* (2006.01)

(52) U.S. Cl.
CPC .......... *H01L 39/226* (2013.01); *G06N 10/00* (2019.01); *H01L 39/025* (2013.01)

(58) Field of Classification Search
CPC ..... H01L 39/226; H01L 39/025; G06N 10/00; H03D 7/005; H03F 19/00; H01P 5/12
See application file for complete search history.

(56) References Cited

U.S. PATENT DOCUMENTS

| | | | |
|---|---|---|---|
| 7,332,738 B2 | 2/2008 | Blais et al. | |
| 7,847,615 B2 | 12/2010 | Yorozu et al. | |
| 9,680,452 B1* | 6/2017 | Abdo | G02F 1/3534 |
| 9,697,473 B2* | 7/2017 | Abdo | H03K 17/92 |

(Continued)

FOREIGN PATENT DOCUMENTS

WO   2016/138406 A1   9/2016

OTHER PUBLICATIONS

International Search Report and Written Opinion received for PCT Application Serial No. PCT/EP2020/083165 dated Mar. 1, 2021, 12 pages.

(Continued)

*Primary Examiner* — Jarrett J Stark
(74) *Attorney, Agent, or Firm* — Amin, Turocy & Watson, LLP

(57) ABSTRACT

A superconducting quantum mechanical device includes first, second, third and fourth Josephson junctions connected in a bridge circuit having first, second and third resonance eigenmodes. The device also includes first and second capacitor pads. The first and second capacitor pads and the bridge circuit form a superconducting qubit having a resonance frequency corresponding to the first resonance eigenmode. The device further includes first and second resonator sections. The first and second resonator sections and the bridge circuit form a resonator having a resonance frequency corresponding to the second resonance eigenmode. The device also includes a source of magnetic flux arranged proximate the bridge circuit. The source of magnetic flux is configured to provide, during operation, a magnetic flux through the bridge circuit to cause coupling between the first, second and third resonance eigenmodes when the third resonance eigenmode is excited.

20 Claims, 3 Drawing Sheets

(56) References Cited

U.S. PATENT DOCUMENTS

| | | | |
|---|---|---|---|
| 9,843,312 B2* | 12/2017 | Abdo | H03F 19/00 |
| 9,858,532 B2* | 1/2018 | Abdo | G06N 10/00 |
| 10,013,657 B2 | 7/2018 | Bourassa et al. | |
| 10,014,859 B2 | 7/2018 | Abdo | |
| 10,211,798 B2* | 2/2019 | Abdo | H01L 39/2493 |
| 10,262,276 B2* | 4/2019 | Puri | G06N 10/00 |
| 10,320,331 B1* | 6/2019 | Abdo | H03H 9/25 |
| 10,944,362 B2 | 3/2021 | Abdo | |
| 10,985,701 B1* | 4/2021 | Abdo | H03F 3/195 |
| 2007/0194225 A1* | 8/2007 | Zorn | G01Q 10/06 |
| | | | 250/306 |
| 2016/0308502 A1 | 10/2016 | Abdo et al. | |
| 2016/0380636 A1 | 12/2016 | Abdo | |
| 2017/0091648 A1* | 3/2017 | Abdo | H03H 7/004 |
| 2017/0093381 A1* | 3/2017 | Abdo | H01L 39/025 |
| 2017/0373369 A1* | 12/2017 | Abdo | H01L 39/223 |
| 2018/0341874 A1 | 11/2018 | Puri et al. | |
| 2019/0190474 A1* | 6/2019 | Abdo | H03F 3/195 |
| 2019/0324846 A1* | 10/2019 | Ioffe | G06F 11/10 |
| 2021/0159384 A1* | 5/2021 | Abdo | H01L 39/223 |

OTHER PUBLICATIONS

Abdo et al., "Time-multiplexed amplification in a hybrid-less and coil-less Josephson parametric converter", arXiv:1609.00401v1 [cond-mat.supr-con], Sep. 1, 2016, 14 pages.

Bergeal et al., "Phase preserving amplication near the quantum limit with a Josephson Ring", Nature, vol. 465, May 6, 2010, pp. 64-68.

Bergeal, et al., "Phase-preserving amplification near the quantum limit with a Josephson ring modulator," Nature 465, 64 (2010).

Abdo, et al., "Josephson amplifier for qubit readout," APL 99, 162506 (2011).

Abdo, et al., "Nondegenerate three-wave mixing with the Josephson ring modulator," PRB 87, 014508 (2013).

Narla, et al., "Wireless Josephson Amplifier," APL 104, 232605 (2014).

Roch, et al., "Widely Tunable, Nondegenerate Three-Wave Mixing Microwave Device Operating near the Quantum Limit," PRL 108, 147701 (2012).

Abdo, et al., "Full Coherent Frequency Conversion between Two Propagating Microwave Modes," PRL 110, 173902 (2013).

Bergeal, et al., "Phase-preserving amplification near the quantum limit with a Josephson ring modulator," Nat. Phys. 6, 296 (2010).

Roy, et al., "Implementation of Pairwise Longitudinal Coupling in a Three-Qubit Superconducting Circuit," Phys. Rev. Applied 7, 054025 (2017).

Leib, et al., "A Transmon Quantum Annealer: Decomposing Many-Body Ising Constraints Into Pair Interactions," arXiv:1604.02359 (2016).

* cited by examiner

SUPERCONDUCTING QUBIT AND RESONATOR SYSTEM BASED ON THE JOSEPHSON RING MODULATOR

BACKGROUND

The currently claimed embodiments of the present invention relate to superconducting quantum mechanical devices, and more specifically, to a superconducting quantum mechanical device having a superconducting qubit coupled to a superconducting resonator within the same device.

Circuit Quantum Electrodynamics (cQED) is a basic and common building block in quantum processor architectures. cQED consists of a superconducting qubit coupled to a superconducting resonator. The resonance frequencies of the qubit and the resonator are usually different. For example, the qubit frequency can be around 5 GHz whereas the resonator frequency can be around 7 GHz. When the frequencies are different, the coupling is referred to as a dispersive coupling. There are various types of qubits that can be used including, for example, transmons, fluxoniums, capacitively-shunted qubits, etc. There are also various geometries of superconducting resonators that can be used including, for example, coplanar waveguide resonators, stripline resonators, microstrip resonators, three-dimensional cavities, etc. Examples of superconducting materials that can be used for the resonators include, but are not limited to, Nb, Al, TiN, NbTiN, NbN, etc. Various mechanisms can be employed for coupling a qubit to a resonator, including capacitive coupling (e.g., through a capacitor), and inductive coupling (e.g., through a mutual inductance).

cQED is used in many applications including: 1) resonator functions as a bandpass filter between the qubit and external circuitry to filter out noise coming through lines at the qubit frequency; 2) the qubit can be driven and controlled by injecting qubit pulses through the resonator port; and 3) the qubit state can be measured by detecting changes in the resonator frequency influenced by the qubit state.

To measure a state of a qubit using the cQED architecture, a readout signal close to the readout resonator frequency is sent to the resonator. Due to coupling (capacitive or inductive) between the qubit and the resonator, the resonator frequency depends on the qubit state. In other words, the resonance frequency of the readout resonator is different when the qubit is in the ground state than when the qubit is in the excited stated. Due to the dependence of the readout resonator resonance frequency on the qubit state, the frequency of the readout signal is set to be in the middle between these two resonance frequencies. By monitoring or measuring a phase shift of a reflected readout signal, one can determine the qubit state because the phase shift would be different depending on the resonance frequency of the readout resonator, which depends on the qubit state.

Therefore, in cQED, the readout resonator can protect the qubit from electromagnetic noise from the external environment. cQED also allows for relatively accurate and sensitive measurement of the qubit state using the resonator. cQED allows for the performance of a quantum non-demolition measurement of the qubit state. In general, the theory of cQED is well developed and the cQED architecture is relatively easy to implement and scale up.

However, in cQED, the coupling between the qubit and readout resonator is always ON. As a result, any noise photons (thermal or non-thermal) present in the readout resonator can cause the qubit state to dephase and lose its phase coherence. One way to circumvent this problem is to increase the bandwidth of the resonator to decrease the time it takes to measure the qubit. However, increasing the bandwidth of the resonator to decrease the time it takes to measure the qubit can also lead to decreasing the lifetime of the qubit (due to the Purcell effect). To combat the Purcell effect and still provide a relatively fast readout, a Purcell filter is usually added to the readout resonator. The Purcell filter is a microwave filter which has almost unity transmission at the readout frequency but large attenuation at the qubit frequency. As a result, this solution adds hardware complexity to the quantum processor architecture.

For qubits that are coupled to relatively slow readout resonators (having narrow bandwidth), qubit dephasing caused by long-lived readout photons (which are part of a readout pulse) can be reduced by quickly emptying the readout resonator of photons using a certain pulse sequence applied to the readout resonator (e.g., the CLEAR method). This solution also adds software, pulse, and timing complexity to the quantum processor architecture.

In conventional devices, to reduce photon population inside the readout resonator and thus reduce qubit dephasing, the coupling between the qubit and readout resonator and the presence of noise photons sets stringent requirement on the qubit setup. For example, the readout resonator is well thermalized to the base-temperature stage, the power of pulses applied are as low as possible to prevent heating effects, the heat dissipation in the environment coupled to the readout resonator should also be minimized, and cryogenic isolators and circulators are added to the output lines to protect against noise including electromagnetic noise such as amplified noise or thermal noise such as blackbody radiation at the readout frequency. These cryogenic circulators and isolators are bulky, hard to thermalize, expensive, heavy, and the use of magnetic materials and strong magnetic fields which can have negative effects of superconducting circuits.

SUMMARY

An aspect of the present invention is to provide a superconducting quantum-mechanical device. The superconducting quantum mechanical device includes a first Josephson junction, a second Josephson junction electrically connected to the first Josephson junction, a third Josephson junction electrically connected to the second Josephson junction and a fourth Josephson junction electrically connected to the third Josephson junction and the first Josephson junction such that the first, second, third and fourth Josephson junctions are connected in a bridge circuit having a first resonance eigenmode, a second resonance eigenmode and a third resonance eigenmode. The superconducting quantum mechanical device also includes a first capacitor pad electrically connected to the first and fourth Josephson junctions at a node therebetween, and a second capacitor pad electrically connected to the second and third Josephson junctions at a node therebetween such that the first capacitor pad, the second capacitor pad and the bridge circuit form a superconducting qubit, the superconducting qubit having a resonance frequency corresponding to the first resonance eigenmode of the bridge circuit. The superconducting quantum mechanical device further includes a first resonator section electrically connected to the first and second Josephson junctions at a node therebetween, and a second resonator section electrically connected to the third and fourth Josephson junctions at a node therebetween such that the first resonator section, the second resonator section and the bridge circuit form a resonator having a resonance frequency corresponding to the second resonance eigenmode. The superconducting quantum mechanical device also includes a source of magnetic flux arranged proximate the bridge circuit. The source of magnetic flux is configured to provide, during operation, a magnetic flux through the bridge circuit to cause coupling between the first, second and third resonance eigenmodes when the third resonance eigenmode is excited.

In an embodiment, the source of magnetic flux is a current-carrying element to provide an electromagnetic source of magnetic flux that flux-biases the bridge circuit. In an embodiment, the source of magnetic flux is a magnetic material to provide an electromagnetic source of magnetic flux that flux-biases the bridge circuit. In an embodiment, the source of magnetic flux is controllable. In an embodiment, the source of magnetic flux provides a half of flux quantum ($\varphi_0/2$).

In an embodiment, the superconducting qubit is a transmon-like qubit. In an embodiment, the first resonator section and the second resonator section are both resonator lines of substantially equal length. In an embodiment, the first resonator section and the second resonator section comprise resonator lines arranged between electrically grounded pads.

In an embodiment, the superconducting quantum-mechanical device further includes a resonator feedline configured to be electromagnetically coupled to the resonator so as to provide excitation of the second resonance eigenmode during operation. In an embodiment, the resonator feedline is separated from the resonator so as to define a capacitor therebetween.

In an embodiment, the superconducting quantum mechanical device further includes a qubit feedline configured to be electromagnetically coupled to the superconducting qubit so as to provide excitation of the first resonance eigenmode during operation. In an embodiment, the qubit feedline is separated from the superconducting qubit so as to define a capacitor therebetween. In an embodiment, the superconducting qubit and the resonator are formed on a same substrate and the bridge circuit is located substantially at a common center of the superconducting qubit and the resonator.

In an embodiment, the first resonator section, the second resonator section, the first Josephson junction, the second Josephson junction, the third Josephson junction and the fourth Josephson junction comprise a superconducting material selected from the group consisting of Al, Nb, NbTiN, NbN and TiN.

In an embodiment, the third resonance eigenmode is excited using a control drive applied to the superconducting qubit or the resonator. In an embodiment, a frequency of the control drive is set to a difference between a qubit frequency of the superconducting qubit and a resonance frequency of the resonator. In an embodiment, an amplitude of the control drive is set to yield full frequency conversion between the superconducting qubit and the resonator. In an embodiment, an amplitude of the control drive is set to yield 50:50 beam-splitting in which half of a qubit information is swapped with half of resonator information. In an embodiment, a frequency of the control drive is set to a sum of a qubit frequency of the superconducting qubit and a resonator frequency of the resonator and an amplitude of the control drive is set to yield two-mode squeezing of the qubit and resonator modes. In an embodiment, a frequency of the control drive is in the microwave frequency range.

The present quantum-mechanical device has many benefits including protecting the qubit from dephasing due to photons or photon noise in the resonator during qubit initialization, single-qubit gates, and/or multi-qubit gates. This is because the qubit mode (X-mode) and the resonator mode (Y-mode) are orthogonal. The X-mode is orthogonal to the Y-mode and these two modes can only be coupled or are able to interact via the third mode (Z-mode) when the control drive signal is ON. As a result, this protection feature allows the device to decrease the number of cryogenic isolators and circulators needed on the output lines. In addition, the qubit can be susceptible to photon noise in the common third mode (Z-mode) of the circuit. However, because the Z-mode is at a different frequency than the readout resonator frequency (Y-mode), the input and output lines can be filtered within a frequency band around this unique frequency without using circulators and/or isolators.

BRIEF DESCRIPTION OF THE DRAWINGS

Concepts of the present invention, as well as methods of operation and functions of related elements of structure and combinations of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
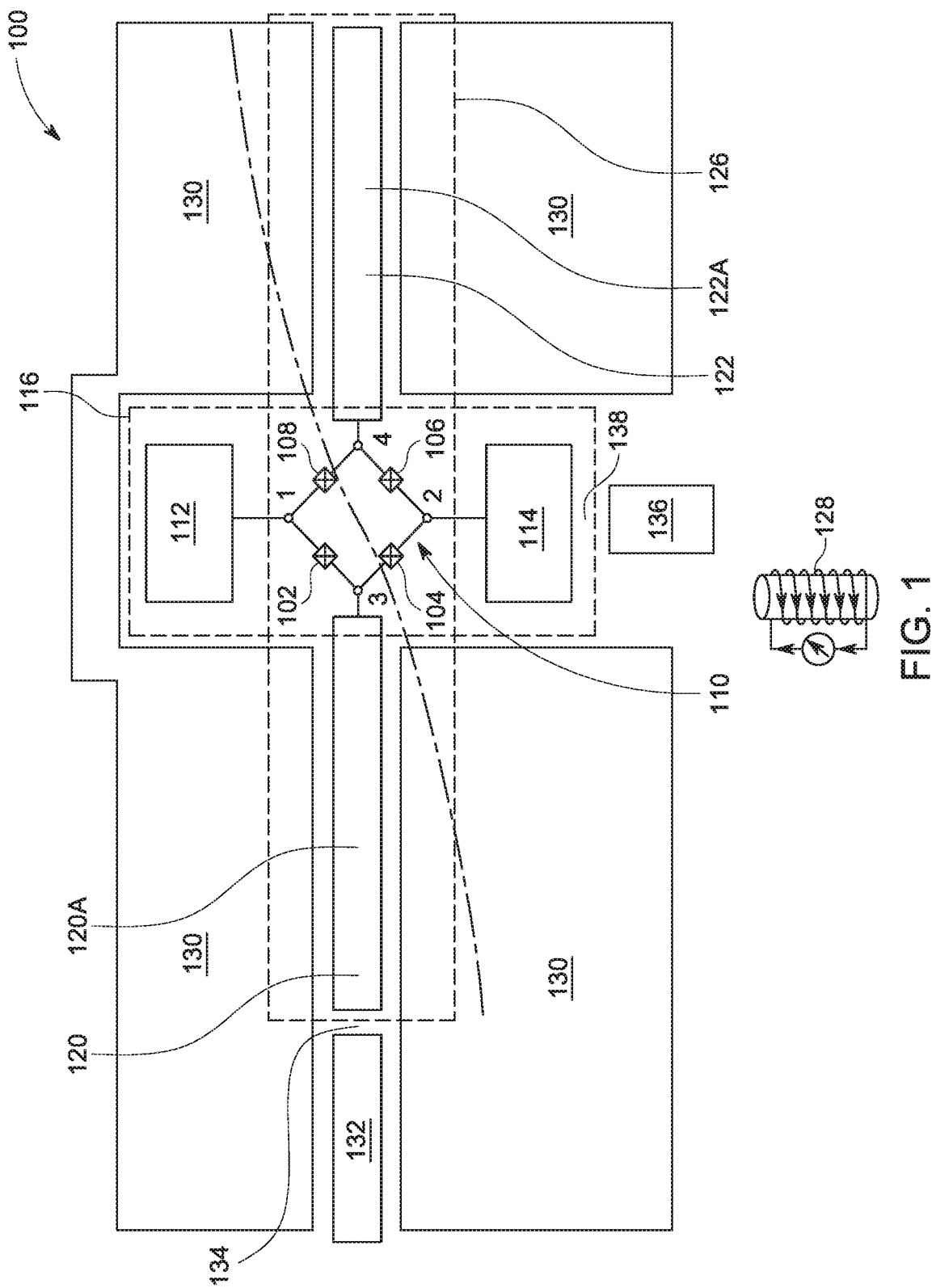
FIG. 1 is schematic diagram of a superconducting quantum-mechanical device, according to an embodiment of the present invention.

FIG. 1 is schematic diagram of a superconducting quantum-mechanical device 100, according to an embodiment of the present invention. The superconducting quantum-mechanical device 100 includes a first Josephson junction 102, a second Josephson junction 104 electrically connected to the first Josephson junction 102, a third Josephson junction 106 electrically connected to the second Josephson junction 104 and a fourth Josephson junction 108 electrically connected to the third Josephson junction 106 and the first Josephson junction 102 such that the first Josephson junction 102, the second Josephson junction 104, the third Josephson junction 106, and the fourth Josephson junction 108 are connected in a bridge circuit 110. The bridge circuit 110 has a first resonance eigenmode, a second resonance eigenmode and a third resonance eigenmode. The bridge circuit 110 is similar to a traditional Wheatstone bridge. However, instead of the resistors in the traditional Wheatstone bridge, the bridge circuit 110 has at least four Josephson junctions arranged in a similar configuration.

Figure 3A:
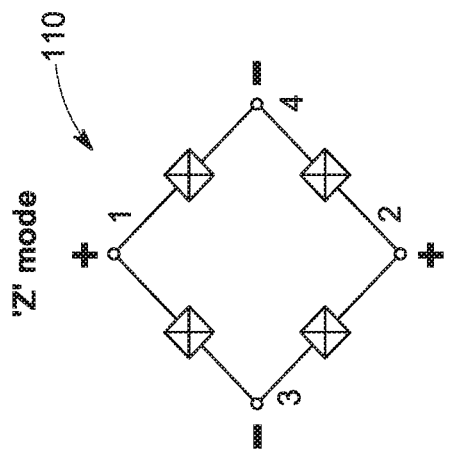
FIGS. 3A-3C show a bridge circuit having a first resonance eigenmode, a second resonance eigenmode and a third resonance eigenmode, according to an embodiment of the present invention.
Figure 3B:
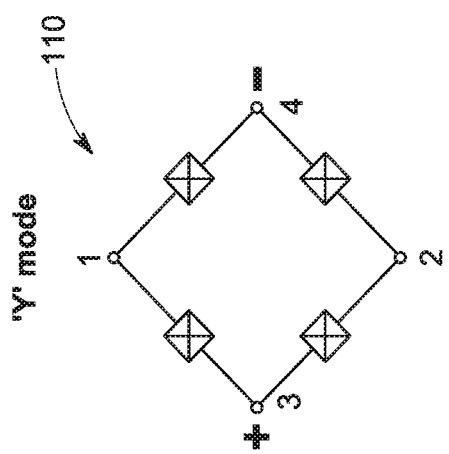
Figure 3C:
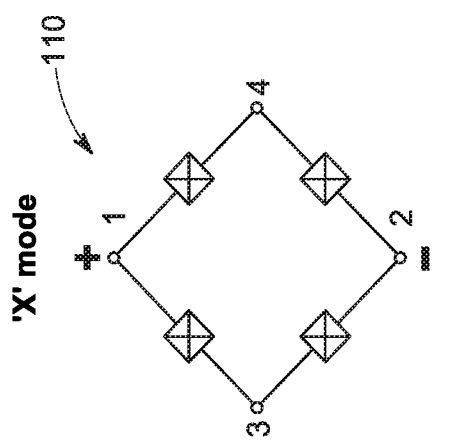

FIGS. 3A-3C show a bridge circuit 110 having a first resonance eigenmode, a second resonance eigenmode and a third resonance eigenmode, according to an embodiment of the present invention. For example, FIG. 3A-3C show the rf voltage polarity on the bridge nodes corresponding to the first, second, and third eigenmodes. FIG. 3A shows the bridge circuit 110 operating in the first eigenmode (X-mode). FIG. 3B shows the bridge circuit 110 operating in the second eigenmode (Y-mode). FIG. 3C shows the bridge circuit 110 operating in the third eigenmode (Z-mode). In some embodiments, the first, second and third eigenmodes are mutually orthogonal to each other. The bridge circuit 110 which can be a Josephson Ring Modulator (JRM) in some embodiments is a nonlinear dispersive circuit based on Josephson tunnel junctions (e.g., four Josephson junctions) that can perform three-wave mixing of electromagnetic signals (e.g., microwave signals) at the quantum limit. However, the broad concepts of the current invention are not limited to only four Josephson junctions. Additional Josephson junction could be included on one or more of the legs of the bridge circuit 110 according to some embodiments.

The superconducting quantum-mechanical device 100 also includes a first capacitor pad 112 electrically connected to the first Josephson junction 102 and fourth Josephson junction 108 at a node 1 therebetween. The superconducting quantum mechanical device 100 also includes a second capacitor pad 114 electrically connected to the second Josephson junction 104 and the third Josephson junction 106 at a node 2 therebetween. The first capacitor pad 112, the second capacitor pad 114 and the bridge circuit 110 form a superconducting qubit 116. The superconducting qubit 116 has a resonance frequency ($f_Q$) corresponding to the first resonance eigenmode (X-mode) of the bridge circuit 110.

The superconducting quantum-mechanical device 100 further includes a first resonator section 120 electrically connected to the first Josephson junction 102 and the second Josephson junction 104 at a node 3 therebetween. The superconducting quantum-mechanical device 100 also includes a second resonator section 122 electrically connected to the third Josephson junction 106 and fourth Josephson junction 108 at a node 4 therebetween. The first resonator section 120, the second resonator section 122 and the bridge circuit 110 form a resonator 126 having a resonance frequency ($f_R$) corresponding to the second resonance eigenmode (Y-mode) of the Bridge circuit 110.

The superconducting quantum-mechanical device 100 also includes a source of magnetic flux 128 arranged proximate the bridge circuit 110. The source of magnetic flux 128 is configured to provide, during operation, a magnetic flux through the bridge circuit 110 to cause coupling between the first, second and third resonance eigenmodes (X-mode, Y-mode, and Z-mode) when the third resonance eigenmode (Z-mode) is excited by an external drive.

In an embodiment, the source of magnetic flux 128 is a current-carrying element to provide an electromagnetic source of magnetic flux that flux-biases the bridge circuit (loop) 110. In another embodiment, the source of magnetic flux 128 is a magnetic material to provide an electromagnetic source of magnetic flux that flux-biases the bridge circuit (loop) 110. The source of magnetic flux 128 is not limited to only these particular examples. It could be a combination of one or more current-carrying elements and/ or one or more magnets formed from magnetic materials. In an embodiment, the source of magnetic flux 128 can be controlled and may be set to provide zero flux. When there is no magnetic flux threading the bridge circuit (loop) 110 the coupling constant between the three eigenmodes vanishes. In another embodiment, the source of magnetic flux 128 can be set to provide a half of flux quantum ($\varphi_0/2$), in which case a coupling is generated between the three eigenmodes.

In an embodiment, the superconducting qubit 116 is a transmon-like qubit. For example, the superconducting qubit 116 can be a transmon-like qubit.

In an embodiment, the first resonator section 120 includes a resonator line 120A and the second resonator section 122 includes a resonator line 122A. In an embodiment, the lines 120A and 122A have substantially equal length. In an embodiment, the first resonator section 120 and the second resonator section 122 are coplanar. In an embodiment, the first resonator section 120 and the second resonator section 122 include microstrips or strip lines. In an embodiment, the first resonator section 120 and the second resonator section 122 include resonator lines 120A and 122A arranged between electrically grounded pads 130.

In an embodiment, the first resonator section 120, the second resonator section 122, the first Josephson junction 102, the second Josephson junction 104, the third Josephson junction 106 and the fourth Josephson junction 108 include a superconducting material such as, but not limited to, Al, Nb, NbTiN, NbN and TiN.

In an embodiment, the superconducting qubit 116 and the resonator 126 are formed on a same substrate and the bridge circuit 110 is located substantially at a common center of, and incorporated into, the superconducting qubit 116 and the resonator 126.

In an embodiment, the superconducting quantum-mechanical device 100 further includes a resonator feedline 132 configured to be electromagnetically coupled to the resonator 126 and carry the input and output readout signals at the readout frequency, which excite the second resonance eigenmode (Y-mode). In an embodiment, the resonator feedline 132 is separated from the resonator 126 so as to define a capacitor 134 therebetween. In an embodiment, the capacitor 134 is defined by the spacing between the resonator feedline 132 and the first resonator section 120 of the resonator 126. The capacitor 134 can electromagnetically couple the resonator feedline 132 to the resonator 126. The excitation of the second resonance eigenmode (Y-mode) can be accomplished by sending a driving signal through the resonator feedline 132 into the resonator 126. For example, in an embodiment, the driving signal can have a frequency in the microwave range. However, the driving signal can also have a frequency in a higher frequency range or lower frequency range.

In an embodiment, the superconducting quantum-mechanical device 100 further includes a qubit feedline 136 configured to be electromagnetically coupled to the superconducting qubit 116 so as to provide excitation of the first resonance eigenmode (X-mode) during operation. In an embodiment, the qubit feedline 136 is separated from the superconducting qubit 116 so as to define a capacitor 138 therebetween. In an embodiment, the capacitor 138 is defined by the spacing between the qubit feedline 136 and the capacitor pad 114 of the qubit 116. The capacitor 138 can electromagnetically couple the qubit feedline 136 to the qubit 116. The excitation of the first resonance eigenmode (X-mode) can be accomplished by sending a driving signal through the qubit feedline 136 into the qubit 116. The excitation of the first, second or third eigenmodes can be accomplished either through the resonator feedline 132 or the qubit feedline 136 by applying a drive signal (for example, a drive signal in the microwave frequency range).

In an embodiment, the third resonance eigenmode (Z-mode) is excited using a control drive signal applied to the superconducting qubit 116 through the qubit feedline 136 or to the resonator 126 through the resonator feedline 132. In an embodiment, a frequency of the control drive is set to a difference between a qubit frequency ($f_Q$) of the superconducting qubit 116 and a resonator frequency ($f_R$) of the resonator 126. In an embodiment, an amplitude of the control drive is set to yield full frequency conversion between the superconducting qubit 116 and the resonator 126. In another embodiment, the amplitude of the control drive is set to yield 50:50 beam-splitting in which half of a qubit information is swapped with half of resonator information.

Figure 2:
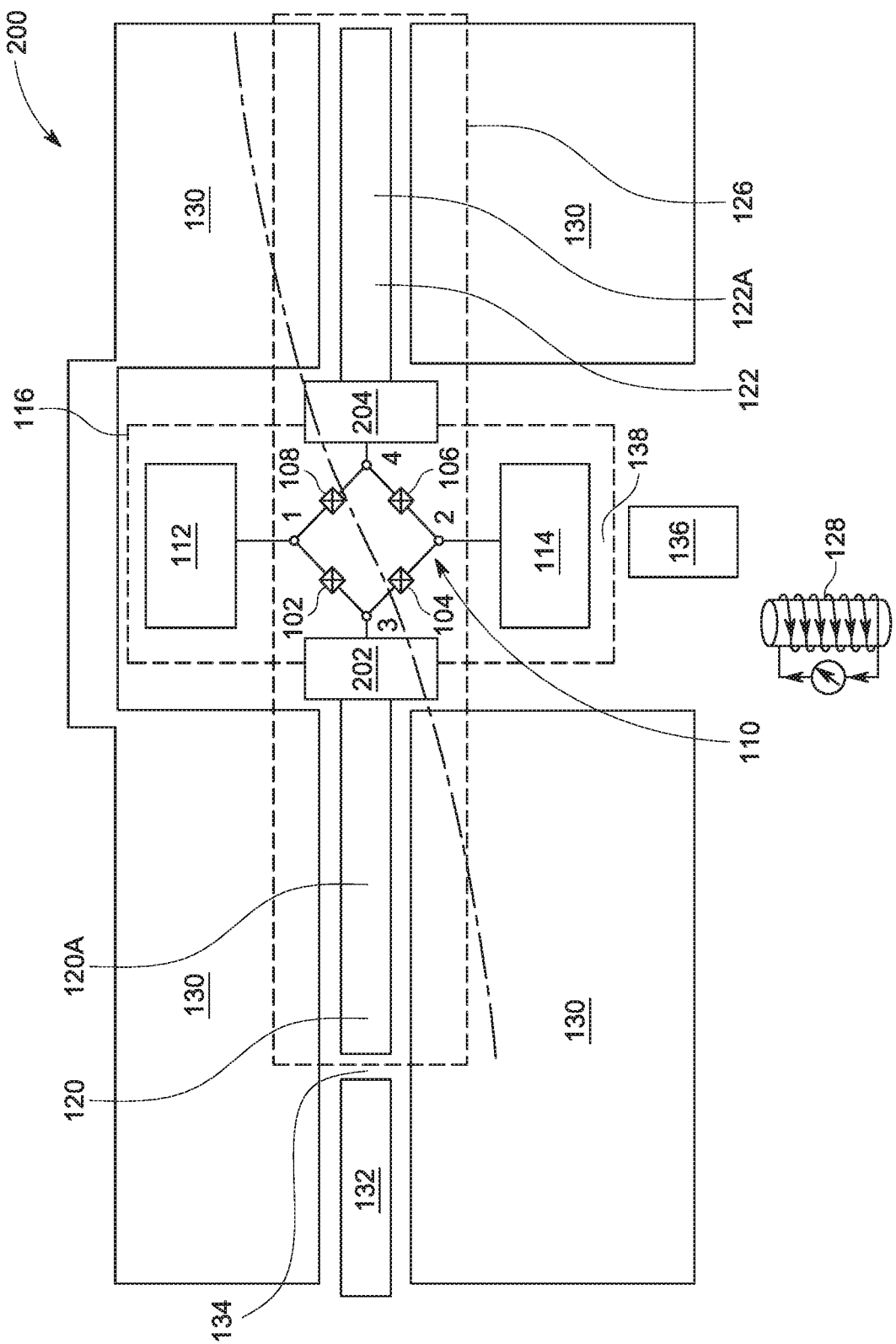
FIG. 2 is schematic diagram of a superconducting quantum-mechanical device, according to another embodiment of the present invention.

FIG. 2 is schematic electric diagram of a superconducting quantum-mechanical device 200, according to another embodiment of the present invention. The superconducting quantum-mechanical device 200 is similar in many aspects to the superconducting quantum-mechanical device 100 described in the above paragraphs. Therefore, same reference numerals are used in FIG. 2 to indicate common components between the superconducting quantum-mechanical devices 100 and 200 and only different features are highlighted in the following paragraphs.

In an embodiment, the superconducting quantum-mechanical device 200 further includes pad 202 connected to node 3 of the bridge circuit 110 and to the first resonator section 120 and pad 204 connected to node 4 of the bridge circuit 110 and to the second resonator section 122. For example, the pad 202 can be provided and connected to an end of the line 120A of the first resonator section 120 that is contiguous to node 3 and pad 204 can be connected to an end of line 122A of the second resonator section 122 that is contiguous to node 4. In another embodiment, instead of using pads 202 and 204, the width of end of line 120A and the width of the end of line 122A can be made larger. Providing pads 202 and 204 or enlarging the ends of the lines 120A and 122A allows reducing the charge dispersion at nodes 3 and 4 by increasing shunting capacitors across the Josephson junctions 102, 104, 106 and 108.

The superconducting quantum-mechanical device 100 and 200 has a number of benefits including protecting the qubit 116 from dephasing due to photons or photon noise in the resonator 126 during qubit initialization, single-qubit gates, and/or multi-qubit gates. This is because the qubit mode (X-mode) and the resonator mode (Y-mode) are orthogonal. The X-mode is orthogonal to the Y-mode and these two modes can only be coupled or are able to interact via the Z-mode when the control drive signal is ON. As a result, this protection feature allows to decrease the number of cryogenic isolators and circulators on the output lines. In addition, the qubit 116 might be susceptible to photon noise in the common mode (Z-mode) of the circuit. However, because the Z-mode is at a different frequency than the readout resonator frequency (Y-mode), the input and output lines can be filtered within a frequency band around this unique frequency without using circulators and/or isolators.

As stated in the above paragraphs, in an embodiment, the frequency of the control drive ($f_D$) can be set to a difference between the qubit frequency ($f_Q$) of the superconducting qubit 116 and the resonator frequency ($f_R$) of the resonator 126, $f_D=|f_Q-f_R|$, and the drive amplitude/power can be set to yield full frequency conversion between the qubit and the resonator. This mode of operation can be used to measure the qubit state. By applying the control drive (excitation or lack of excitation), the qubit state is swapped with the resonator readout photons. By measuring the output readout photons one can infer the qubit state. It is worthwhile noting that it is possible to use the resonator 120 as a storage resonator (i.e., memory) instead of a readout resonator.

As stated in the above paragraphs, in another embodiment, the amplitude of the control drive can be set to yield 50:50 beam-splitting in which half of a qubit information is swapped with half of resonator information. In this case, the control drive frequency is still $f_D=|f_Q-f_R|$. However, the amplitude or power is set to yield 50:50 beam-splitter point, in which half of the qubit information is swapped with half of the resonator information while the other half is retained in the qubit and the resonator. By measuring the output readout photon one can entangle the qubit state with the flying photon, i.e., the output readout photon. Therefore, by measuring the output readout photon it is possible to infer the qubit state.

In another embodiment, the control drive frequency $f_D$ can be set instead to be equal to the sum of the qubit frequency $f_Q$ and the resonator frequency $f_R$. $f_D=|f_Q+f_R|$ and the drive amplitude or power can be set to yield two-mode squeezing of the qubit and resonator modes. Due to a longitudinal coupling between the resonator and the qubit, this mode of operation might offer very fast high-fidelity readout of the qubit state (faster than cQED that use transverse coupling). This mode of operation might eliminate the need for quantum-limited Josephson amplifiers in the readout chain and the overhead and loss of the necessary intermediate stages.

In yet another embodiment, a full conversion mode followed by four-wave mixing operation (single-mode squeezing or amplification) can be implemented. In this mode, the qubit and resonator information is swapped and then by applying a relatively strong pump (relatively high power) to the resonator at the resonator frequency $f_R$ (or at double the resonator frequency, $2f_R$), the reflected readout signal can be squeezed or amplified which can lead to boosting the measurement signal-to-noise ratio (SNR). Such a single-mode squeezing or amplification can be useful in implementing certain error-correction bosonic codes. In another embodiment, in a four-wave operation (single-mode squeezing), the vacuum noise inside the readout resonator is squeezed before performing the information swap between the qubit and the resonator.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

I claim:

1. A superconducting quantum-mechanical device, comprising:
   a first Josephson junction, a second Josephson junction electrically connected to the first Josephson junction, a third Josephson junction electrically connected to the second Josephson junction and a fourth Josephson junction electrically connected to the third Josephson junction and the first Josephson junction, wherein the first Josephson junction, the second Josephson junction, the third Josephson junction, and the fourth Josephson junction are connected in a bridge circuit having a first resonance eigenmode, a second resonance eigenmode and a third resonance eigenmode;
   a first capacitor pad electrically connected to the first Josephson junction and the fourth Josephson junctions at a first node therebetween, and a second capacitor pad electrically connected to the second Josephson junction and the third Josephson junctions at a second node therebetween, wherein the first capacitor pad, the second capacitor pad, and the bridge circuit form a superconducting qubit having a first resonance frequency corresponding to the first resonance eigenmode of the bridge circuit;

a first resonator section electrically connected to the first Josephson junction and the second Josephson junctions at a third node therebetween, and a second resonator section electrically connected to the third Josephson junction and the fourth Josephson junctions at a fourth node therebetween, wherein the first resonator section, the second resonator section, and the bridge circuit form a resonator having a second resonance frequency corresponding to the second resonance eigenmode, wherein the first resonator section comprises a first resonator line, and wherein a first end portion of the first resonator line electrically connected to the third node is wider than other portions of first resonator line; and a source of magnetic flux configured to provide, during operation, a magnetic flux through the bridge circuit to cause coupling between the first resonance eigenmode, the second resonance eigenmode, and the third resonance eigenmode when the third resonance eigenmode is excited.

2. The superconducting quantum-mechanical device according to claim 1, wherein the source of magnetic flux comprises a current-carrying element that provides an electromagnetic source of magnetic flux that flux-biases the bridge circuit.

3. The superconducting quantum-mechanical device according to claim 1, wherein the source of magnetic flux comprises a magnetic material that provides an electromagnetic source of magnetic flux that flux-biases the bridge circuit.

4. The superconducting quantum-mechanical device according to claim 1, wherein the source of magnetic flux is controllable.

5. The superconducting quantum-mechanical device according to claim 1,
wherein the source of magnetic flux provides a half of flux quantum (cpo/2).

6. The superconducting quantum-mechanical device according to claim 1, wherein the superconducting qubit is a transmon qubit.

7. The superconducting quantum-mechanical device according to claim 1, wherein the second resonator section comprises a second resonator line that has a substantially equal length to the first resonator line.

8. The superconducting quantum-mechanical device according to claim 1, wherein the first resonator line is arranged between electrically grounded pads.

9. The superconducting quantum-mechanical device according to claim 1, further comprising a resonator feedline configured to be electromagnetically coupled to the resonator, wherein the resonator feedline provides a drive signal that excites the second resonance eigenmode during operation.

10. The superconducting quantum-mechanical device according to claim 8, wherein the resonator feedline is separated from the resonator to define a capacitor therebetween.

11. The superconducting quantum-mechanical device according to claim 1, further comprising a qubit feedline configured to be electromagnetically coupled to the superconducting qubit, wherein the qubit feedline provides a drive signal that excites the first resonance eigenmode during operation.

12. The superconducting quantum-mechanical device according to claim 10, wherein the qubit feedline is separated from the superconducting qubit so as to define a capacitor therebetween.

13. The quantum device according to claim 1, wherein the superconducting qubit and the resonator are formed on a same substrate and the bridge circuit is located substantially at a common center of the superconducting qubit and the resonator.

14. The superconducting quantum-mechanical device according to claim 1, wherein the first resonator section, the second resonator section, the first Josephson junction, the second Josephson junction, the third Josephson junction and the fourth Josephson junction comprise a superconducting material selected from the group consisting of Al, Nb, NbTiN, NbN and TiN.

15. The superconducting quantum-mechanical device according to claim 1, wherein the third resonance eigenmode is excited using a control drive signal applied to the superconducting qubit or the resonator.

16. The superconducting quantum-mechanical device according to claim 15, wherein a frequency of the control drive signal is set to a difference between a qubit frequency of the superconducting qubit and the second resonance frequency of the resonator.

17. The superconducting quantum-mechanical device according to claim 15, wherein an amplitude of the control drive signal is set to yield full frequency conversion between the superconducting qubit and the resonator.

18. The superconducting quantum-mechanical device according to claim 15, wherein an amplitude of the control drive signal is set to yield 50:50 beam-splitting in which half of a qubit information is swapped with half of resonator information.

19. The superconducting quantum-mechanical device according to claim 15, wherein a frequency of the control drive signal is set to a sum of a qubit frequency of the superconducting qubit and the second resonance frequency of the resonator and an amplitude of the control drive signal is set to yield two-mode squeezing of a qubit mode and a resonator mode.

20. The superconducting quantum-mechanical device according to claim 15, wherein a frequency of the control drive signal is in the microwave frequency range.

* * * * *